(12) United States Patent
Choi et al.

(10) Patent No.: US 10,705,116 B2
(45) Date of Patent: Jul. 7, 2020

(54) TEST SOCKET OF FLEXIBLE SEMICONDUCTOR CHIP PACKAGE AND BENDING TEST METHOD USING THE SAME

(71) Applicant: MagnaChip Semiconductor, Ltd., Cheongju-si (KR)

(72) Inventors: Jae Sik Choi, Cheongju-si (KR); Jin Won Jeong, Seoul (KR); Young Sug Seong, Cheongju-si (KR); Dong Keun Lee, Cheongju-si (KR)

(73) Assignee: MagnaChip Semiconductor, Ltd., Cheongju-si (KR)

( * ) Notice: Subject to any disclaimer, the term of this patent is extended or adjusted under 35 U.S.C. 154(b) by 72 days.

(21) Appl. No.: 15/992,543

(22) Filed: May 30, 2018

(65) Prior Publication Data

US 2019/0079114 A1    Mar. 14, 2019

(30) Foreign Application Priority Data

Sep. 14, 2017    (KR) .................... 10-2017-0117555

(51) Int. Cl.
*G01R 1/04* (2006.01)
*H01L 23/498* (2006.01)
*G01R 1/073* (2006.01)

(52) U.S. Cl.
CPC .......... *G01R 1/0466* (2013.01); *G01R 1/0735* (2013.01); *H01L 23/4985* (2013.01)

(58) Field of Classification Search
CPC ... H01L 23/4985; H01L 23/5387; G01N 3/20; G01R 1/0466

(Continued)

(56) References Cited

U.S. PATENT DOCUMENTS 5,034,685 A * 7/1991 Leedy ................ G01R 1/07307
257/E21.526
5,175,491 A * 12/1992 Ewers .................. G01R 1/0433
324/750.05

(Continued)

FOREIGN PATENT DOCUMENTS

| JP | 3-88174 U | 9/1991 |
|---|---|---|
| JP | 10-260424 A | 9/1998 |
| JP | 2000321188 A * | 11/2000 |

OTHER PUBLICATIONS

ASTM Plastic and Insulating Material Flexural Testing, https://www.admet.com/testing-applications/testing-standards/astm-d6272-plastic-and-insulating-material-flexural-testing/, 2016 (Year: 2016).*

(Continued)

*Primary Examiner* — Patrick Assouad
*Assistant Examiner* — Demetrius R Pretlow
(74) *Attorney, Agent, or Firm* — NSIP Law

(57) ABSTRACT

A test socket of a flexible semiconductor chip package includes a first bending jig having a convex contour, a second bending jig having a concave contour, and a semiconductor chip package. The second bending jig is disposed to matingly engage the first bending jig. The semiconductor chip package is disposed between the first bending jig and the second bending jig, and includes a flexible tape and a semiconductor chip. The semiconductor chip is disposed on a surface of the flexible tape. Each of the first and second bending jigs has a horizontal length longer than a length of the semiconductor chip and less than a length of the flexible tape.

20 Claims, 11 Drawing Sheets

(58) Field of Classification Search
USPC .................................... 324/756.02; 73/849
See application file for complete search history.

(56) References Cited

U.S. PATENT DOCUMENTS

| | | | | |
|---|---|---|---|---|
| 5,767,689 | A * | 6/1998 | Tokuno | G01R 1/0408 |
| | | | | 324/756.02 |
| 5,808,474 | A * | 9/1998 | Hively | G01R 1/0483 |
| | | | | 324/756.02 |
| 5,889,212 | A * | 3/1999 | Guthrie | A61B 5/02158 |
| | | | | 600/485 |
| 6,100,709 | A * | 8/2000 | Marieb | G01R 31/2887 |
| | | | | 324/750.16 |
| 7,214,962 | B2 * | 5/2007 | Akram | H01L 23/13 |
| | | | | 257/48 |
| 8,365,611 | B1 * | 2/2013 | Darveaux | G01N 3/32 |
| | | | | 324/762.01 |
| 9,869,717 | B2 | 1/2018 | Lim et al. | |
| 10,197,482 | B2 * | 2/2019 | Gao | G01N 3/00 |
| 2003/0061885 | A1 * | 4/2003 | Auch | G01N 3/20 |
| | | | | 73/849 |
| 2006/0137465 | A1 * | 6/2006 | Lee | G01N 3/20 |
| | | | | 73/794 |
| 2008/0018353 | A1 * | 1/2008 | Thamarayoor | G01R 1/0483 |
| | | | | 324/756.02 |
| 2012/0169366 | A1 | 7/2012 | Iy et al. | |
| 2016/0165726 | A1 | 6/2016 | Lee et al. | |
| 2016/0258852 | A1 * | 9/2016 | Bellemare | G01N 3/46 |
| 2017/0102302 | A1 * | 4/2017 | Gao | G01N 3/00 |
| 2018/0265731 | A1 * | 9/2018 | Ekinaka | C09D 7/62 |

OTHER PUBLICATIONS

Korean Office Action dated Jul. 31, 2018 in corresponding Korean Patent Application No. 10-2017-0117555 (5 pages in Korean).

* cited by examiner

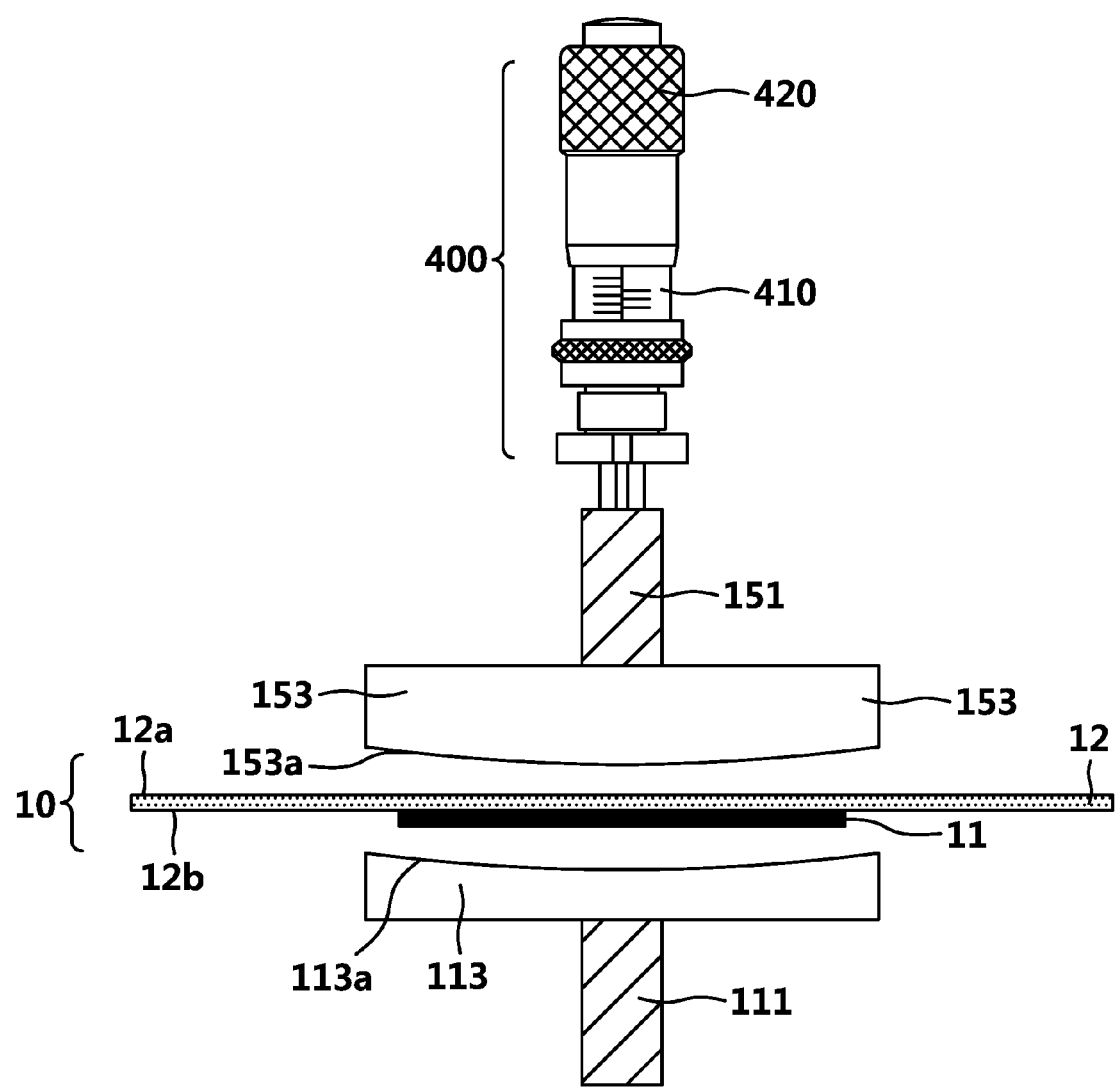

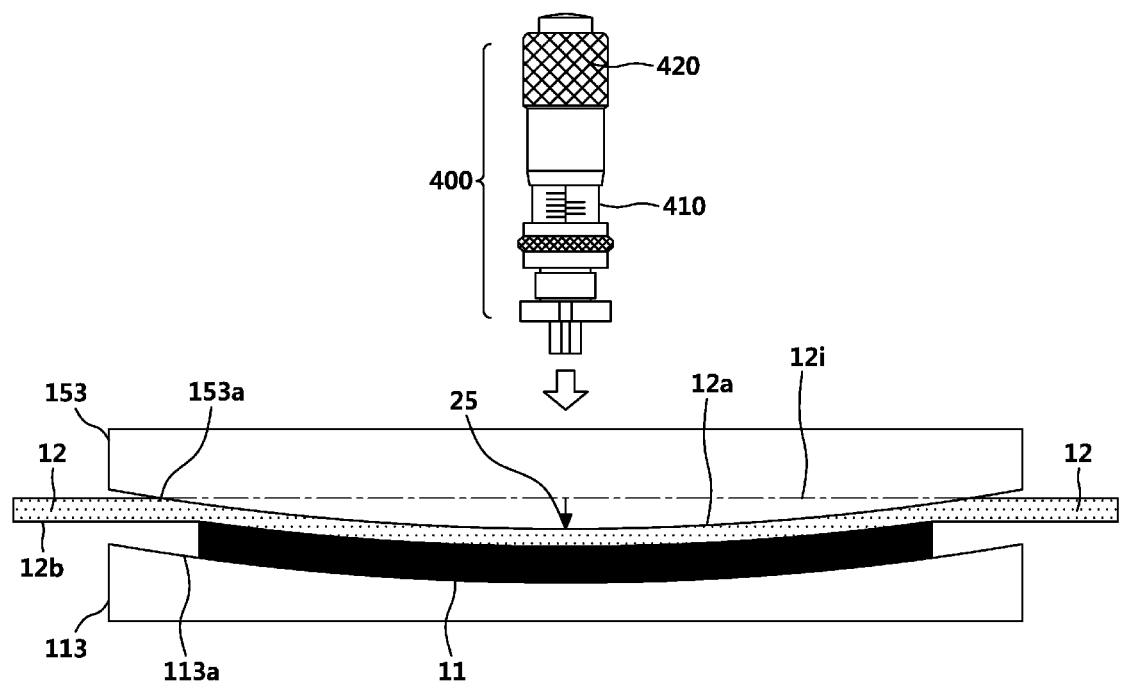

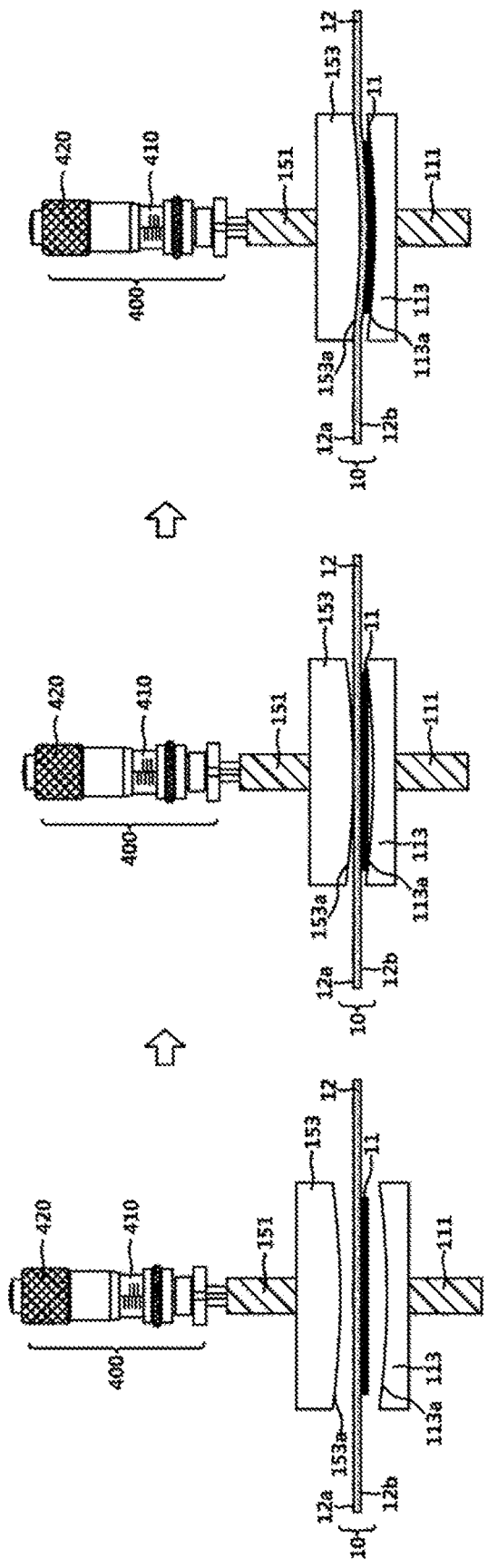

TEST SOCKET OF FLEXIBLE SEMICONDUCTOR CHIP PACKAGE AND BENDING TEST METHOD USING THE SAME

CROSS-REFERENCE TO RELATED APPLICATIONS

This application claims the benefit under 35 U.S.C. 119(a) of Korean Patent Application No. 10-2017-0117555 filed on Sep. 14, 2017 in the Korean Intellectual Property Office, the entire disclosure of which is incorporated herein by reference for all purposes.

BACKGROUND

1. Field

Embodiments of the present disclosure relates to a test socket of a flexible semiconductor chip package and a bending test method using the same, and in particular, to a test socket of a flexible semiconductor chip package and a method using the same that is capable of bending testing a display driver IC (Integrated Circuit) for driving a flexible display in a bent state.

2. Description of Related Art

Flexible displays are next-generation display devices that are transformable, for example, foldable or bendable, unlike to flat panel displays.

The display driver IC (semiconductor chip) for driving a flexible display transmits signals to the flexible display through a plurality of input/output pads electrically connected to the semiconductor chip.

The semiconductor chip includes at least 1000 pins connecting the plurality of input/output pads, and when the semiconductor chip is bent due to the narrow width of each pin, the input/output pads are deformed.

Electrical testing of a semiconductor chip for driving a flexible display was conducted in a state where the semiconductor chip is flat finally after repeatedly being bent and flat. As observed, when power is applied to a bent semiconductor chip, the obtained result may be different from that obtained from a test conducted in the state where the semiconductor chip is flat.

Korean Patent Registration No. 10-1464990 discloses an aligned semiconductor device socket unit for accurately conducting a test of conductivity that ensures mutual alignment of a ball terminal of a semiconductor device mounted on a test object carrier and a probe pin supported on a socket assembly to improve accuracy.

However, the prior art document relates to an invention for stably testing conductivity in a state where a semiconductor device is flat, and there still remains a problem as to whether a video can be displayed without distortions even when power is applied in a bent state of the semiconductor device.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a test socket of a flexible semiconductor chip package includes a first bending jig having a convex contour, a second bending jig having a concave contour, and a semiconductor chip package. The second bending jig is disposed to matingly engage the first bending jig. The semiconductor chip package is disposed between the first bending jig and the second bending jig, and includes a flexible tape and a semiconductor chip. The semiconductor chip is disposed on a surface of the flexible tape. Each of the first and second bending jigs has a horizontal length longer than a length of the semiconductor chip and less than a length of the flexible tape.

Each of the first bending jig and the second bending jig may include an elastic material.

The test socket of the flexible semiconductor chip package may further include a first bolt extending from and linearly driving the first bending jig; and a second bolt extending from and linearly driving the second bending jig.

The test socket of the flexible semiconductor chip package may further include a top guide comprising the first bending jig; a bottom guide comprising the second bending jig; and a tape guide disposed between the top guide and the bottom guide, wherein the semiconductor chip package is disposed on the tape guide.

Physical movements of the semiconductor chip package may be restricted by a first tape fixing part disposed in the top guide and a second tape fixing part disposed in the tape guide.

The semiconductor chip package may further include an input pad and an output pad in the flexible tape configured to contact the contacting part; and an alignment key in the flexible tape. The bottom guide may include an alignment pin; and a contacting part.

The tape guide may include a tape carrier and a tape bracket. The semiconductor chip package may be disposed between the tape carrier and the tape bracket.

The first bending jig and an installed display panel may have a same curvature radius.

The installed display panel may include any one of LCD, AMOLED, PMOLED, and micro-LED.

In another general aspect, a bending test method of a flexible semiconductor chip package includes mounting a semiconductor chip package in a test socket, wherein the semiconductor chip package comprises a flexible tape and a semiconductor chip disposed on the flexible tape, and wherein the test socket comprises a top guide, a tape guide, a bottom guide, a first bolt extending from a first bending jig and a second bolt extending from a second bending jig; contacting a convex contoured surface of the first bending jig with the semiconductor chip; fastening the second bolt to drive a concave contoured surface of the second bending jig to contact a surface of the flexible tape; and fixing the semiconductor chip in a bent state between the first bending jig and the second bending jig.

The mounting the semiconductor chip package in the test socket may include mounting the semiconductor chip package in the tape guide; and disposing the tape guide having the semiconductor chip package between the top guide and the bottom guide.

The tape guide may include a tape carrier and a tape fixing part. The semiconductor chip package may be disposed on the tape carrier and the tape fixing part.

The bending test method of the flexible semiconductor chip package may further include mounting the test socket on a pin guide comprising a plurality of test pin guides; and connecting a plurality of input/output pads of the flexible tape with a test board through the plurality of test pin guides.

When positions of the first bending jig and the second bending jig are reversed, the concave contoured surface of the second bending jig may be in contact with the semiconductor chip and the convex contoured surface of the first bending jig may be in contact with the flexible tape.

The bending test method may produce electrical parameters such as drain current (Id), breakdown voltage (BD-VSS) and leakage current (Isub) of the semiconductor chip.

In another general aspect, a bending test apparatus includes a test socket; a first bending jig having a convex contour disposed in the test socket; a second bending jig having a concave contour disposed to matingly engage the first bending jig; a semiconductor chip disposed between the first bending jig and the second bending jig; and a test board configured to connect and test electrical performance of the semiconductor chip.

The first bending jig and the second bending jig may be configured to bend the semiconductor chip bent vertically upward or downward during the electrical performance testing.

Other features and aspects will be apparent from the following detailed description, the drawings, and the claims.

BRIEF DESCRIPTION OF THE DRAWINGS

FIG. 2 is a cross-sectional view of an embodiment of a pair of bending jigs and a semiconductor chip package disposed therebetween.

FIG. 3 is a cross-sectional view of an embodiment of a semiconductor chip package that is bent by a pair of bending jigs.

FIGS. 4A-4C are conceptual diagrams of bending steps in which a semiconductor chip package is uniformly bent at a constant radius of curvature according to an embodiment.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

The features of the examples described herein may be combined in various ways as will be apparent after an understanding of the disclosure of this application. Further, although the examples described herein have a variety of configurations, other configurations are possible as will be apparent after an understanding of the disclosure of this application.

The present disclosure describes a test socket of a flexible semiconductor chip package and a bending test method using the same is objected to testing a semiconducting chip in a bent state by using bending jigs having a convex or concave contour.

Figure 1:
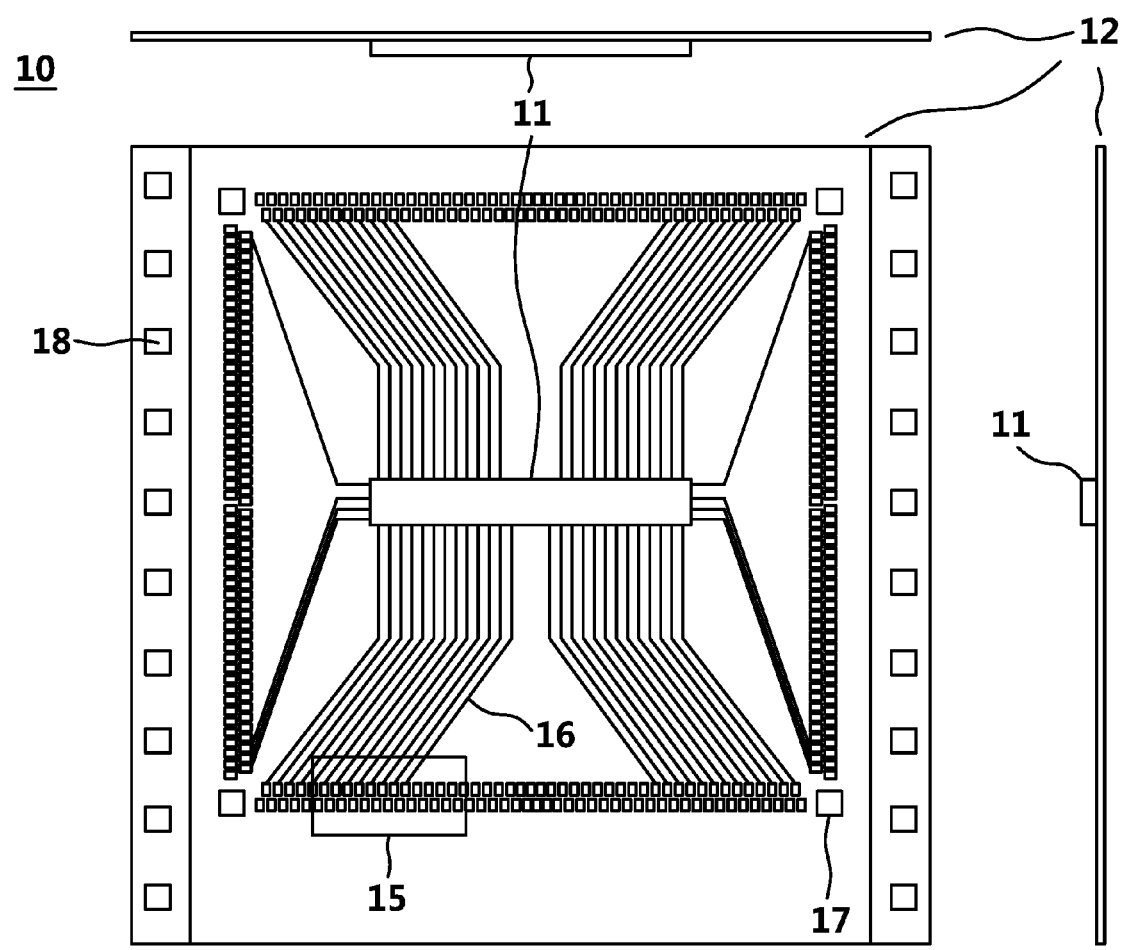
FIG. 1 is a diagram of an embodiment of a semiconductor chip package.

FIG. 1 is a diagram of an embodiment of a semiconductor chip package.

As illustrated in FIG. 1, a flexible semiconductor device package 10 (hereinafter referred to as "semiconductor chip package") may include a flexible tape 12 (or flexible film), a semiconductor chip 11, and a plurality of input/output pads 15. The flexible tape 12 is made with a silicon-based film material, so it has some flexibility. A plurality of tape holes 18 are formed in both ends of the flexible tape 12 in a Y-axis direction, and a plurality of metal wires 16 made with copper metal and so on are formed in the flexible tape 12. The semiconductor chip 11 is disposed at a center of a first surface of the flexible tape 12, and a metal bump (not illustrated) formed in the semiconductor chip is electrically connected to the plurality of metal wires 16 formed in the flexible tape. The metal wire is electrically connected to the input/output pads 15. The input/output pads 15 are electrically connected to test pins, which are explained later. An electrical performance test of the semiconductor chip 11 for driving a flexible display is capable of being conducted via test pins. In addition, there is an alignment key 17 that uniformly aligns input/output pads and input/output pads. Here, the semiconductor chip 11 is a semiconductor chip for driving a flexible display and is an Integrated Circuit (IC) for driving a display panel such as LCD, AMOLED, PMOLED, and so on.

FIG. 2 is a cross-sectional view of an embodiment of a pair of bending jigs and a semiconductor chip package disposed therebetween.

Referring to FIG. 2, a gauge 400 for inducing bending of a semiconductor chip package 10 is depicted. Here, bending refers to a state of bending to have a uniform curvature. The gauge 400 includes a graduated ruler 410 and a rotation means 420. The graduated ruler 410 is graduated even at a micrometer (μm) unit level. The gauge 400 is for minutely adjusting the degree of bending the semiconductor chip package. The gauge 400 is in contact with a first bolt 151 or a second bolt 111, so the bolt may be pushed downward at a desired depth using the rotation means 420 of the gauge 400, which means that the first bolt 151 or second bolt 111 is moved in a vertical direction by the gauge. That is, the movement of the first bolt 151 or second bolt 111 is finely controlled by the gauge 400. However, the movement of the first bolt 151 and second bolt 111 are not limited thereto. The gauge 400 may be in contact with both the first bolt 151 and the second bolt 111, so that the first bolt 151 and the second bolt 111 are moved in opposing directions towards each other by the gauge.

A pair of bending jigs includes a first bending jig 153 and a second bending jig 113 are disposed under the gauge 400. The first bending jig 153 and the first bolt 151 are disposed to be symmetrical to the second bending jig 113 and the second bolt 111, respectively. Here, the first bending jig 153 extends from the first bolt 151 to form one body. Similarly, the second bending jig 113 extends from the second bolt 111 to form another body. The first bending jig 153 has a convex contour 153a. In contrast, the second bending jig 113 has a concave contour 113a. The concave contour and the convex contour are disposed to matingly engage each other in a one-to-one correspondence. In the case where the concave contour is in contact with the convex contour, they are designed to have no gap between the facing surfaces. A semiconductor chip 11 to be tested is disposed between the first bending jig 153 and the second bending jig 113. Here, the semiconductor chip 11 is disposed beneath a bottom surface 12b of a flexible tape 12. A top surface 12a of the flexible tape 12 is disposed to face the convex contour 153a of the first bending jig 153, while the bottom surface of the flexible tape 12 is disposed to face the concave contour 113a of the second bending jig 113.

The first bending jig 153 and the second bending jig 113 are disposed to be symmetrical to each other. Each of the first bending jig 153 and the second bending jig 113 may be detachably attached, and swappable with each other. The first bolt and the second bolt are connected to the first bending jig and the second bending jig, respectively. The more the first bolt descends, the more the semiconductor chip bends. The movement of the first bolt is minutely controlled by the gauge 400.

The first bending jig 153 and the second bending jig 113 may be made of aluminum metal, an allow of aluminum metal, or may be manufactured by coating a surface of the aluminum metal with elastic material such as rubber, Teflon, or polyurethane. For example, the convex contour of the first bending jig 153 and/or the concave contour of the second bending jig 113 may be made of elastic material. The convex contour of the first bending jig 153 and the concave contour of the second bending jig 113 are in contact with the flexible tape or the semiconductor chip. When force or stress is applied to the semiconductor chip 11 and the tape by the first and second bending jigs, the jigs would absorb the since the jigs are made of an elastic material. Here, instead of the aluminum that is used for the first bending jig 153 and second bending jig 113, either an aluminum plated with titanium or an aluminum plated with a black-colored metal may be used. The widths of the first and second bending jigs may be at least greater than the major axis length of the semiconductor chip because the entire semiconductor chip would be bent if the widths are greater than the major axis length. However, the widths need not be greater than the length of the tape in a major axis direction. Therefore, on the basis of the major axis of the semiconductor chip, the widths of the bending jigs are at least greater than the length of the magnet chip and less than the width of the tape.

FIG. 3 is a cross-sectional view of an embodiment of a semiconductor chip package that is bent by a pair of bending jigs.

As illustrated in FIG. 3, force is applied by a first bending jig 153 to bend a flexible tape 12 and a semiconductor chip 11 attached to the flexible tape 12 to form a shape having the surface contour of the first bending jig 153. Various electrical tests are then performed in the bent semiconductor chip 11. Typically, electrical tests are performed on a semiconductor chip that is not bent. The fine adjustment of the gauge allows the semiconductor chip to be precisely and uniformly bent. In this example, only the portion of the flexible tape with which the convex contour of the first bending jig is in contact is bent. The other portion of the flexible tape remains flat.

A bolt is moved by the gauge by a distance 25 according to the radius of curvature of a display panel to which the semiconductor chip is attached, for example. Here, the radius of curvature refers to a unit indicating the degree of bending of a flexible display, which means that the smaller radius of curvature, the more the flexible display is bent; in contrast, the bigger radius of curvature, the less the flexible display is bent. Since the display panel becomes less bent as the radius of curvature becomes bigger, the distance 25 of the movement of bolt becomes smaller. For example, if the radius of curvature of a display panel to be exhibited is about 300 mm, a distance of about 0.5 mm to 1.5 mm may be moved in a vertical direction using a bolt. In contrast, if the radius of curvature is about 50 mm, a distance of about 0.5 mm to 2.0 mm may be moved in a vertical direction using a bolt. Here, the radius of curvature of the display panel is same as a radius of curvature of a bending jig. For example, if the radius of curvature of a display panel to be exhibited is 300 mm, the radius of curvature of a bending jig also becomes 300 mm, too. The process of bending executed by a precise gauge and a bending jig having a constant curvature result in a semiconductor chip that also has a constant curvature. That is, the central portion of the semiconductor chip has a same curvature as an end portion thereof. In other was, the radius of curvature of a bending jig determine the radius of curvature of the semiconductor chip.

The FIGS. 4A-4C are conceptual diagrams of bending steps in which a semiconductor chip package is uniformly bent at a constant radius of curvature according to an embodiment.

FIG. 4A is an initial setting step of the first bending jig 153. A flexible tape 12 to which a semiconductor chip 11 is attached is disposed between the first and second bending jigs 153, 113. In this state, there is no force exerted by the first and second bending jigs 153, 113 on the flexible tape 12 and the semiconductor chip 11.

In FIG. 4B, the first bending jig 153 is moved by an operation of a gauge 400 until the first bending jig 153 touches the semiconductor chip 11. When the first bending jig 153 is moved by minutely adjusting the distance between the first bending jig 153 and the second bending jig 113 using a driver 400, the first bending jig 153 will come into contact with a top surface 12a of the flexible tape 12. In addition, the second bending jig 113 will come into contact with a bottom surface of the semiconductor chip. However, even in this state, the semiconductor chip 11 remains flat because force is yet to be transferred from the first bending jig 153 to the semiconductor chip 11.

In FIG. 4C, the semiconductor chip 11 is bent by contact force transferred from the first bending jig 153. That is, in FIG. 4C, the semiconductor chip 11 is bent to have a constant radius of curvature, e.g., 300 mm, by adjusting the gauge 400. When contact is made between the semiconductor chip 11 and a convex contour 153a, and force or pressure is transferred to the semiconductor chip 11 through the bending jig 153, the distance between the first and second bending jigs 153, 113 is finely adjusted by an operation of the gauge 400. The first bending jig 153 moves downward by a sum of the thicknesses of the flexible tape 12 and the semiconductor chip 11. In this example, the second bending jig 113 remains fixed without movement. A tension torque may be set when moving the first bending jig 153 in order for the bolt 151 not to move beyond a specific distance.

Figure 5A:
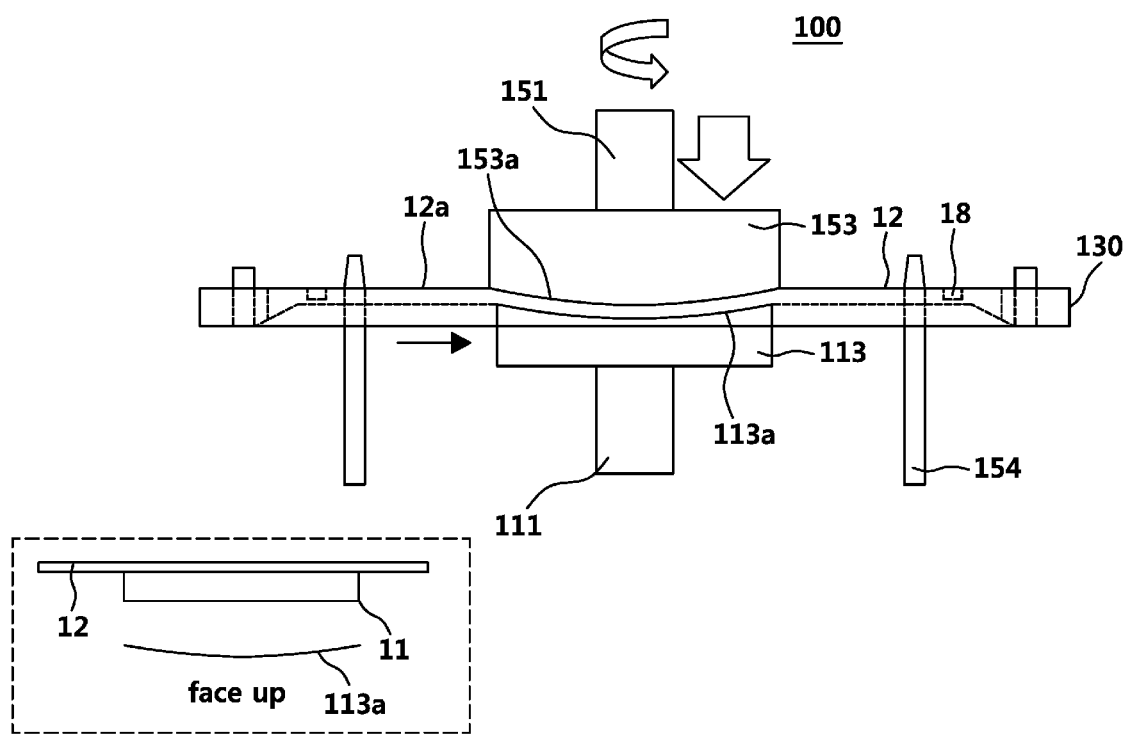
FIG. 5A is a conceptual diagram of a test socket for bending a semiconductor chip to a face-up state according to an embodiment.

FIG. 5A is a conceptual diagram of a test socket 100 for bending a semiconductor chip to a face-up state according to an embodiment. Referring to FIG. 5A, a convex contour 153a of a first bending jig 153 is disposed to face a surface of a flexible tape 12. A concave contour 113a of a second bending jig 113 is located to face a semiconductor chip 11 formed in a second surface of the flexible tape 12.

A first bolt 151 is rotated in a fastening direction so that the convex contour of the first bending jig 153 comes into contact with a surface 12a of the flexible tape 12 and presses the semiconductor chip 11 into the concave contour of the second bending jig 113 forming a constant radius of curvature. In this example, the second bolt 111 is fixed. This state is referred to as a face-up state because the first surface of the flexible tape 12 in which the semiconductor chip 11 is formed curves outwards in the middle.

Figure 5B:
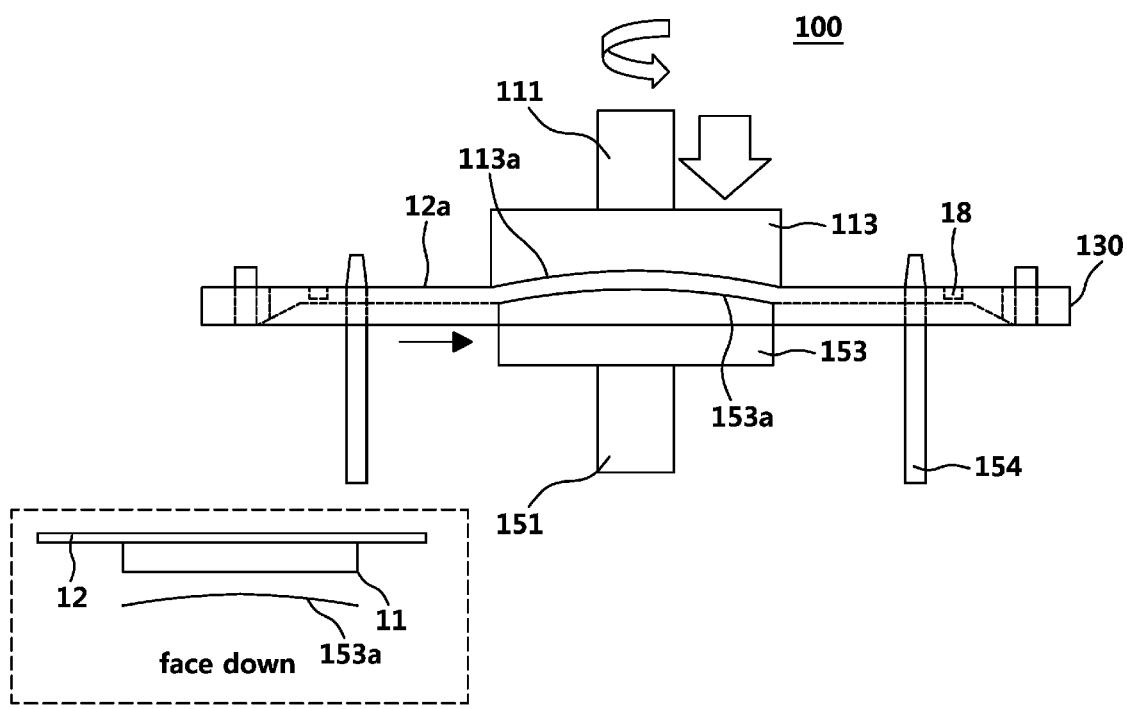
FIG. 5B is a conceptual diagram of a test socket for bending a semiconductor chip to a face-down state according to an embodiment.

FIG. 5B is a conceptual diagram of a test socket 100 for bending a semiconductor chip to a face-down state according to an embodiment. Contrary to FIG. 5A, in a test socket 100 of FIG. 5B, the locations of a first bending jig 153 and a second bending jig 113 are switched. It is easily understood that the locations of the first and second bolts may be changed. The first bending jig 153 is located under the flexible tape, and the second bending jig 113 is located on the flexible tape.

A convex contour 153a of the first bending jig 153 is located to directly face a semiconductor chip 11 formed in a first surface of the flexible tape 12. A concave contour 113a of the second bending jig 113 is located to face a surface 12a of the flexible tape 12.

The most convex contour of the first bending jig 153 comes into contact with the semiconductor chip 11, and a second bolt 111 is rotated downward so that a concave contour of the second bending jig 113 comes into contact with a surface 12a of the flexible tape 12, which results in pressing a first point and a second point of the flexible tape. The first and second points are points that are spaced apart by a predetermined distance from the center. Therefore, the flexible tape 12 is bent concavely by the second bending jig 113 (that is, face down), and the semiconductor chip 11 attached to the flexible tape is bent at a constant radius of curvature. Both of the first and second points of the flexible tape 12 in which the semiconductor chip 11 is formed move downward, so this state is referred to as a face-down state.

Figure 6:
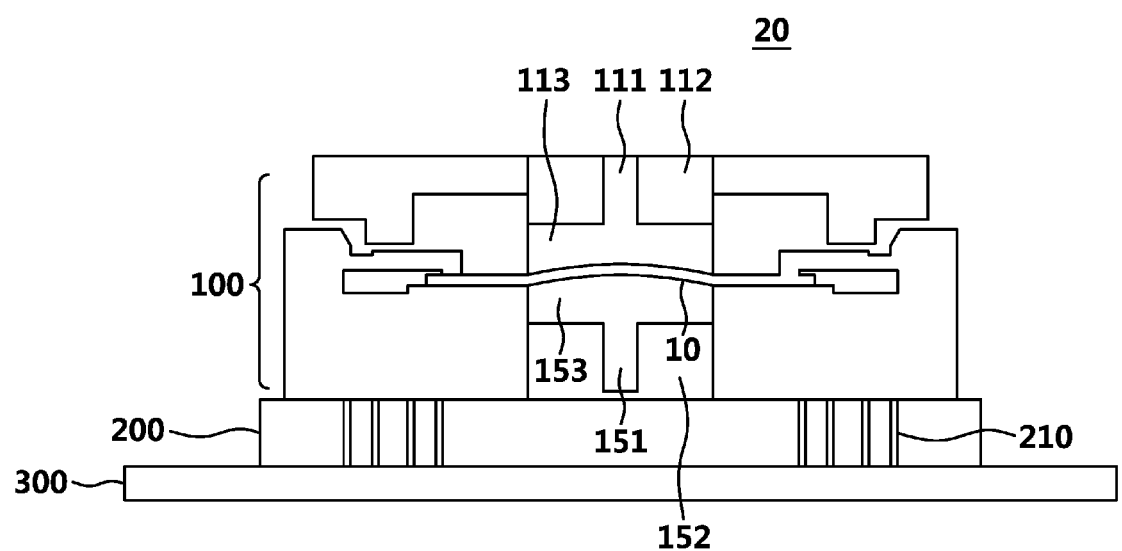
FIG. 6 is an embodiment of a bending testing apparatus for flexible semiconductor chip package using test socket.

FIG. 6 is an embodiment of a bending testing apparatus for flexible semiconductor chip package using a test socket. Referring to FIG. 6, the bending testing apparatus 20 includes a test socket 100 having a flexible semiconductor chip package (hereinafter referred to as "test socket"), a pin guide 200, and a test board 300. The test board tests electrical performance of the semiconductor chip, such as drain current, sub-leakage current, and breakdown voltage, etc. The test socket 100 is a socket for bending a semiconductor chip 11 at a constant radius of curvature by using the bending jigs 153, 113 that are illustrated and described in FIG. 2, and it will be described in detail when describing FIGS. 7 to 9.

The pin guide 200 is mounted on the test board 300, and the test socket 100 is detachably attached on the pin guide 200. The pin guide 200 includes a plurality of test pin guides 210 therein, and an input/output pad 15 of a semiconductor chip package included in the test socket 100 is electrically connected to the test board 300 through the test pin guides 210.

Accordingly, by using the test socket 100 to bend the semiconductor chip at a constant radius of curvature and attaching the test socket 100 on the pin guide 200, the semiconductor chip may be powered in a bent state, and thus, tests may be performed even in the bent semiconductor chip. The electrical parameters such as drain current (Id), breakdown voltage (BDVSS) and leakage current (Isub) of the semiconductor chip are produced through the bending test method and the bending test apparatus.

Figure 7A:
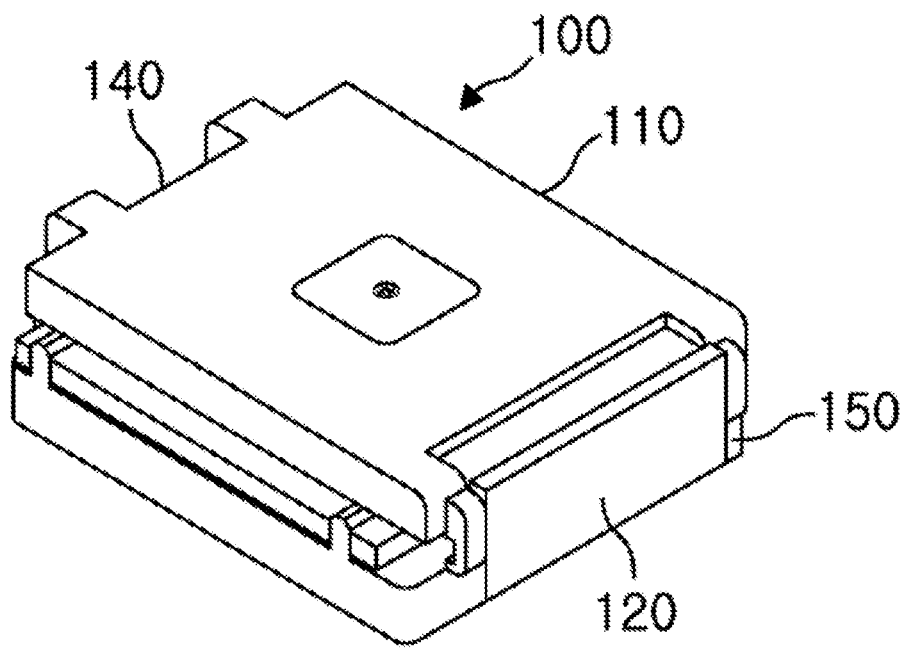
FIG. 7A is a diagram of an embodiment of an external structure of a test socket.
Figure 7B:
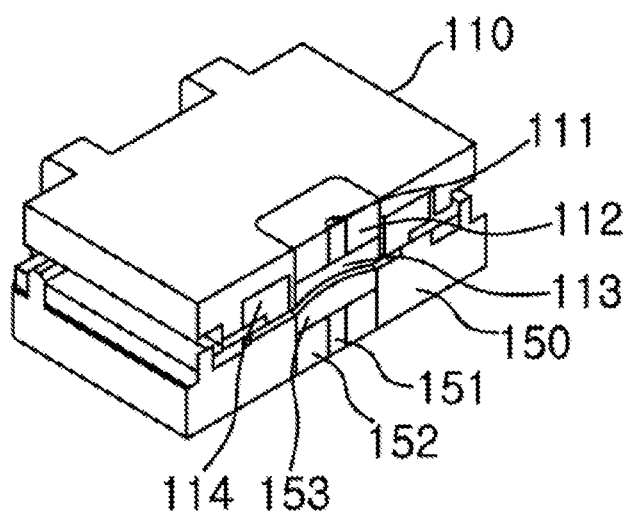
FIG. 7B is a cross-sectional view of the test socket illustrated in FIG. 7A.
Figure 7C:
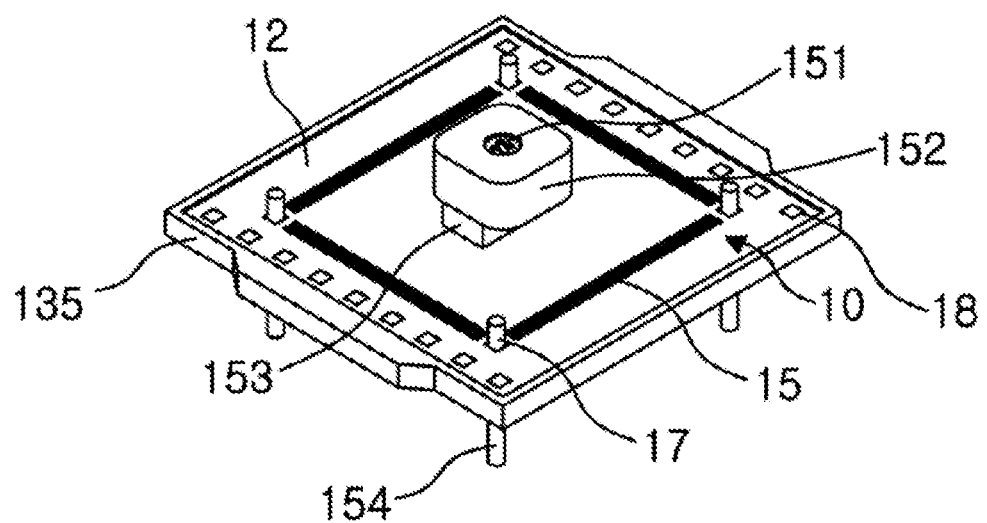
FIG. 7C is a diagram of an internal structure of the test socket illustrated in FIG. 7A.

FIG. 7A is a diagram of an embodiment of an external structure of a test socket; FIG. 7B is a cross-sectional view of the test socket illustrated in FIG. 7A; and FIG. 7C is a diagram of an internal structure of the test socket illustrated in FIG. 7A.

Referring to FIG. 7A, the test socket 100 includes a top guide 110, a bottom guide 150, an opening/closing means 140, and a locking means 120. The opening/closing means 140 is located between the top guide 110 and the bottom guide 150 and serves to open and close the top guide 110. The locking means 120 fixedly fastens the top guide 110.

Referring to FIG. 7B, at the center of the bottom guide 150, there are a first bending jig 153 with a convex contour, a first bolt 151 formed on the first bending jig 153, and a first bolt guide 152 enclosing the first bolt 151. At the center of the top guide 110, there are second bending jig 113 with concave contour, a second bolt 111 formed on the second bending jig 113, and a second bolt guide 112 enclosing the second bolt 111. The first bending jig 153 and the second bending jig 113 are disposed to be symmetrical to each other up and down with respect to a semiconductor chip package 10. Each of the first bending jig 153 and the second bending jig 113 is detachable, and they may be switched each other.

In the top guide 110 of the semiconductor chip package, a first tape fixing part 114 made of rubber may be formed and disposed on both sides of the second bending jig 113. The first tape fixing part 114 comes into contact with a flexible tape 12 when the semiconductor chip is bent at a constant radius of curvature to prevent movement of the flexible tape 12. In addition, inside the test socket, bolt guides 112 and 152 for guiding bolts 111 and 151 are disposed on and under the semiconductor chip package 10, respectively.

As illustrated in FIG. 7C, inside the test socket, a semiconductor chip package 10 is disposed with a tape bracket 135. The tape bracket 135 is for supporting the semiconductor chip package 10. The semiconductor chip package 10 includes a semiconductor chip 11 attached to a flexible tape 12 as illustrated in FIG. 1 and also includes an input/output pad 15, an alignment key 17, and a tape hole 18. As illustrated in the FIG. 7C, a bending jig 153 in contact with the semiconductor chip package 10 is disposed. A hole is formed in the alignment key 17, so an alignment pin 154 is inserted into the hole, and thus, it serves to fix the semiconductor chip package or the flexible tape. The input/output pad 15 formed in the flexible tape 12 comes into contact with a contacting part 155 formed in the bottom guide 150 illustrated in FIG. 8. The contacting part 155 is connected to a plurality of test pins. The test pins are inserted into a plurality of test pin guides 210 in a pin guide 200, so electrical tests may be performed using the test board.

Figure 8:
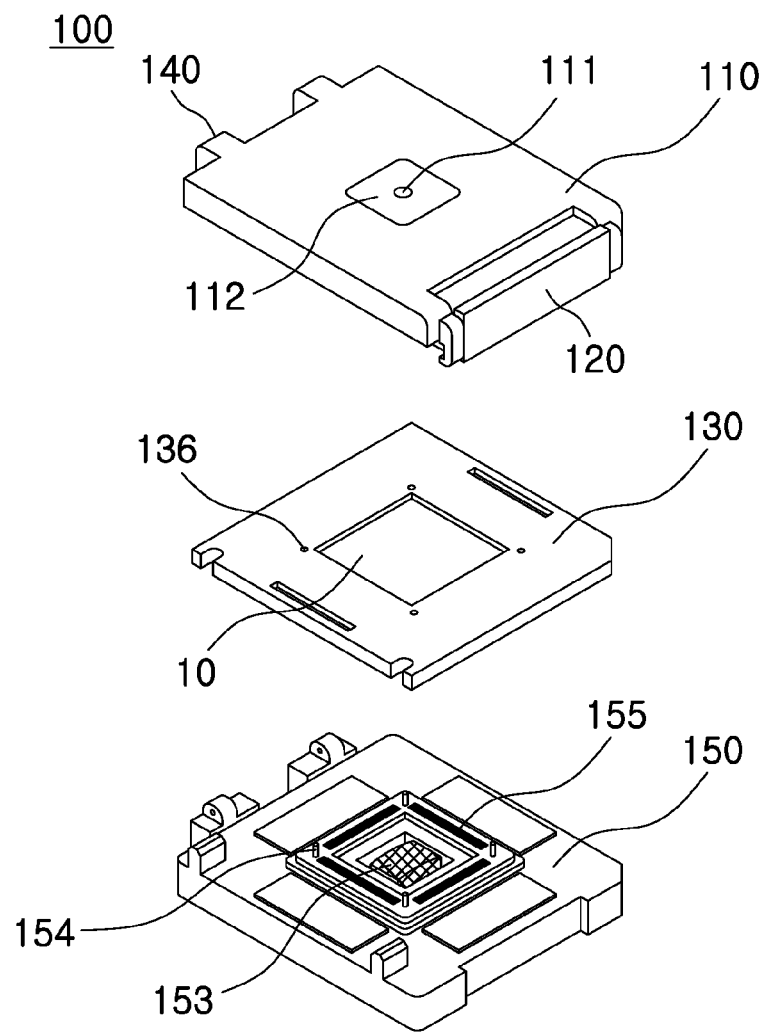
FIG. 8 is an exploded diagram of an embodiment of a test socket.

FIG. 8 is an exploded diagram of an embodiment of a test socket. Referring to FIG. 8, a test socket 100 may include a top guide 110, a locking means 120, a tape guide 130, an opening/closing means 140, and a bottom guide 150.

The opening/closing means 140 is installed between the top guide 110 and the bottom guide 150 to open and close the top guide 110. The locking means 120 fixedly fastens the top guide 110.

At the center of the top guide 110, there are a second bolt 111, a second bolt guide 112 enclosing the second bolt 111, and a second bending jig formed under the second bolt guide 112.

The tape guide 130 is disposed between the top guide 110 and the bottom guide 150, and a semiconductor chip package 10 is mounted in the tape guide 130. The tape guide 130 includes an opening portion formed at the center thereof and an insertion hole 136 formed at each corner of the opening portion. The details of the tape guide 130 will be described referring to FIG. 9.

At the center of the bottom guide 150, there may be a first bolt (not illustrated), a first bolt guide enclosing the first bolt (not illustrated), and a first bending jig 153 formed on the first bolt guide. The bottom guide 150 may include an opening portion to expose the first bending jig 153, a contacting part 155 formed around the opening portion, and an alignment pin 154 formed at each corner of the opening portion. The contacting part 155 is mounted with a plurality of test pins. Therefore, the plurality of test pins may be in contact with a plurality of input/output pads 15 of the semiconductor chip package 10. That is, the plurality of input/output pads 15 may align with the contacting part 155 of the bottom guide 150. Therefore, the plurality of input/output pads 15 of the semiconductor chip package 10 may be electrically connected to a test board (300 of FIG. 6) through the contacting part 155. The alignment pin 154 may pass through a hole formed at each corner of the semiconductor chip package 10 and be inserted into an insertion hole 136 formed in the tape guide 130.

Figure 9:
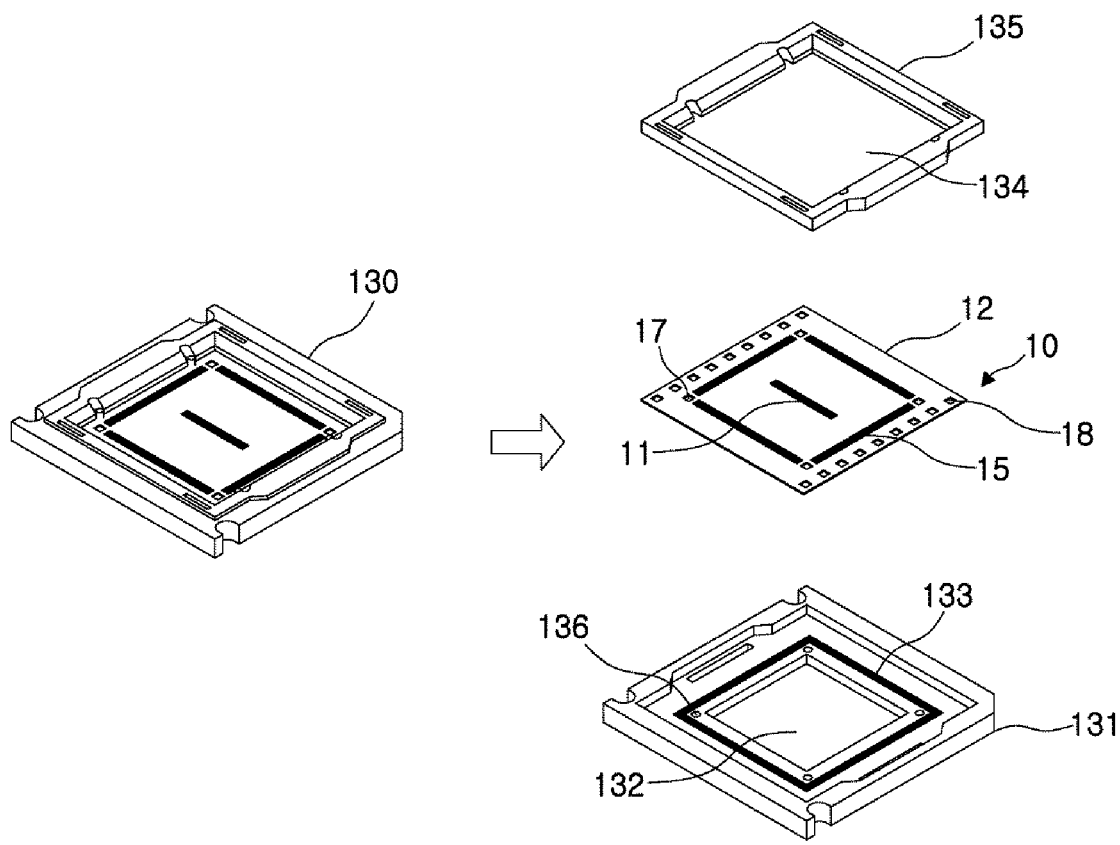
FIG. 9 is an exploded diagram of a tape guide illustrated in FIG. 8 according to an embodiment.

FIG. 9 is an exploded diagram of a tape guide illustrated in FIG. 8 according to an embodiment.

Referring to FIG. 9, a tape guide 130 may include a tape carrier 131 and a tape bracket 135. The tape guide 130 of FIG. 9 is obtained by rotating the tape guide of FIG. 8 by 180 degrees.

A semiconductor chip package 10 may be mounted in the tape carrier 131. In the tape carrier 131, an opening portion 132 is formed at the center thereof, and a second tape fixing part 133 is disposed around the opening portion 132. The second tape fixing part 133 may be a metallic material coated with an elastic material or an elastic material such as rubber. For example, the second tape fixing part 133 may be one of aluminum coated with Teflon, a material made of rubber only, and a material made of polyurethane. Alternatively, the second tape fixing part 133 may be an elastic material made of directly coating a top surface of a tape carrier 131 with an elastic material. The movement of the flexible tape 12 may be physically restricted by the tape carrier 131 via the second tape fixing part 133 when a semiconductor chip 11 of a semiconductor chip package 10 is bent. Since the movement of the flexible tape is restricted, the transformation of a plurality of input/output pads 15 is restricted as well even if the semiconductor chip 11 is bent, thereby having the effect of preventing a contacting part 155 of the bottom guide 150 illustrated in FIG. 8 from being mismatched.

The tape carrier 131 may include an opening portion 132 formed at the center thereof and an insertion hole 136 formed at each corner of the open portion 132. An alignment pin (154 of FIG. 8) is inserted into the insertion hole 136.

After the semiconductor chip package 10 is mounted on the tape carrier 131, a tape bracket 135 is mounted on the semiconductor chip package 10. At the center of the tape bracket 135, an opening portion 134 is formed to expose the semiconductor chip 11 of the semiconductor chip package 10 and a plurality of input/output pads 15.

The tape guide 130 has a form such that the semiconductor chip package 10 is mounted on the tape carrier 131 and the tape bracket 135 is mounted on the semiconductor chip package 10.

As illustrated in FIGS. 6 to 9, describing again, the test socket 100 includes the top guide 110, the bottom guide 150, and the tape guide 130. The tape guide 130 is disposed between the top guide 110 and the bottom guide 150. The top and bottom guides include bending jigs, bolts, and bolt guides. The tape guide 130 includes the tape carrier 131 and the tape bracket 135. The semiconductor chip package 10 is disposed inside the tape guide 130 and disposed between the tape carrier 131 and the tape bracket 135. The tape bracket 135 and tape carrier 131 are for supporting the semiconductor chip package 10 from above and below, respectively.

The first tape fixing part 114 included in the top guide 110 prevents the flexible tape 12 from moving by the contact of the flexible tape therewith. In addition, the second tape fixing part 133 formed in the tape carrier 131 prevents the flexible tape 12 from moving by the contact of the flexible tape therewith. The movement of the semiconductor chip package 10 is restricted by the first tape fixing part 114 and the second tape fixing part 133, thereby preventing the semiconductor chip package 10 formed in the flexible tape from moving even under a bending test condition.

Figure 10:
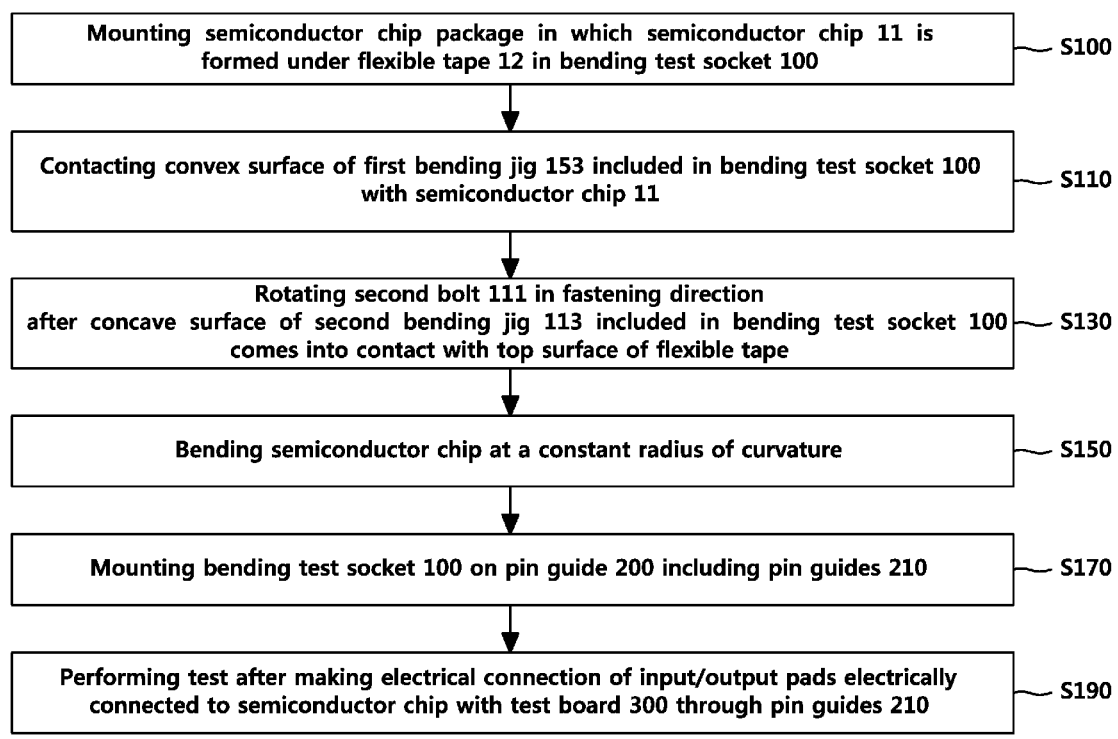
FIG. 10 is a flow chart for explaining an embodiment of a bending test method of a flexible semiconductor chip package.

FIG. 10 is a flow chart for explaining an embodiment of a bending test method of a flexible semiconductor chip package. Referring to FIG. 10, a test socket 100 is mounted in a semiconductor chip package in which a semiconductor chip 11 is formed under a flexible tape 12 (S100).

A convex contour of a first bending jig 153 included in the test socket 100 comes into contact with a semiconductor chip 11 (S110). A concave contour of a second bending jig 113 included in the test socket 100 comes into contact with a top surface of the flexible tape, and a second bolt 111 is rotated in a fastening direction (S130).

The semiconductor chip 11 is bent at a constant radius of curvature (S150).

Referring to FIG. 6 and FIG. 10, the test socket 100 is mounted on a pin guide 200 including a plurality of pin guides 210 (S170). A plurality of input/output pads electrically connected to the semiconductor chip are electrically connected to a test board 300 through the plurality of pin guides 210, and a test is performed (S190).

The test socket of a flexible semiconductor chip package and the bending test method using the same of the present application as described above bends the semiconductor chip at a constant radius of curvature using a bending jig formed in a convex contour, and thus, may provide an effective testbed for testing the semiconductor chip in a bent state.

In addition, the test socket of a flexible semiconductor chip package and the bending test method using the same of the present application may minimize damage to the semiconductor chip and prevent the transformation of a plurality of input/output pads electrically connected to the semiconductor chip during testing of the semiconductor chip in a bent state.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A test socket of a flexible semiconductor chip package, comprising:
    a first bending jig having a convex contour;
    a second bending jig having a concave contour disposed to matingly engage the first bending jig; and
    a semiconductor chip package disposed between the first bending jig and the second bending jig, and comprising:
        a flexible tape; and
        a semiconductor chip disposed on a surface of the flexible tape,
    wherein each of the first and second bending jigs has a horizontal length longer than a length of the semiconductor chip and less than a length of the flexible tape.

2. The test socket of the flexible semiconductor chip package of claim 1, wherein each of the first bending jig and the second bending jig comprises an elastic material.

3. The test socket of the flexible semiconductor chip package of claim 1, further comprising:
    a first bolt extending from and linearly driving the first bending jig; and
    a second bolt extending from and linearly driving the second bending jig.

4. The test socket of the flexible semiconductor chip package of claim 1, further comprising:
    a top guide comprising the first bending jig;
    a bottom guide comprising the second bending jig; and
    a tape guide disposed between the top guide and the bottom guide, wherein the semiconductor chip package is disposed on the tape guide.

5. The test socket of the flexible semiconductor chip package of claim 4, wherein physical movements of the semiconductor chip package is restricted by a first tape fixing part disposed in the top guide and a second tape fixing part disposed in the tape guide.

6. The test socket of the flexible semiconductor chip package of claim 4,
    wherein the bottom guide comprises:
        an alignment pin; and
        a contacting part, and
    wherein the semiconductor chip package further comprises:
        an input pad and an output pad in the flexible tape configured to contact the contacting part; and
        an alignment key in the flexible tape.

7. The test socket of the flexible semiconductor chip package of claim 4, wherein the tape guide comprises a tape carrier and a tape bracket, and
    wherein the semiconductor chip package is disposed between the tape carrier and the tape bracket.

8. The test socket of the flexible semiconductor chip package of claim 1, wherein the first bending jig and an installed display panel has a same curvature radius.

9. The test socket of the flexible semiconductor chip package of claim 8, wherein the installed display panel comprises any one of LCD, AMOLED, PMOLED, and micro-LED.

10. A bending test method of a flexible semiconductor chip package, comprising:
    mounting a semiconductor chip package in a test socket, wherein the semiconductor chip package comprises a flexible tape and a semiconductor chip disposed on the flexible tape, and wherein the test socket comprises a top guide, a tape guide, a bottom guide, a first bolt extending from a first bending jig and a second bolt extending from a second bending jig;
    contacting a convex contoured surface of the first bending jig with the semiconductor chip;
    fastening the second bolt to drive a concave contoured surface of the second bending jig to contact a surface of the flexible tape; and
    fixing the semiconductor chip in a bent state between the first bending jig and the second bending jig.

11. The bending test method of the flexible semiconductor chip package of claim 10,
    wherein the mounting the semiconductor chip package in the test socket comprises:
    mounting the semiconductor chip package in the tape guide; and
    disposing the tape guide having the semiconductor chip package between the top guide and the bottom guide.

12. The bending test method of the flexible semiconductor chip package of claim 10,
    wherein the tape guide comprises a tape carrier and a tape fixing part, and
    wherein the semiconductor chip package is disposed on the tape carrier and the tape fixing part.

13. The bending test method of the flexible semiconductor chip package of claim 10, further comprising:
    mounting the test socket on a pin guide comprising a plurality of test pin guides; and
    connecting a plurality of input/output pads of the flexible tape with a test board through the plurality of test pin guides.

14. The bending test method of the flexible semiconductor chip package of claim 10,
    wherein when positions of the first bending jig and the second bending jig are reversed, the concave contoured surface of the second bending jig is in contact with the semiconductor chip and the convex contoured surface of the first bending jig is in contact with the flexible tape.

15. The bending test method of the flexible semiconductor chip package of claim 10, wherein the bending test method produces electrical parameters such as drain current (Id), breakdown voltage (BDVSS) and leakage current (Isub) of the semiconductor chip.

16. A bending test apparatus comprising:
    a test socket;
    a first bending jig having a continuously convex contour disposed in the test socket;

a second bending jig having a concave contour disposed to matingly engage the first bending jig;

a semiconductor chip disposed between the first bending jig and the second bending jig, wherein the semiconductor chip is disposed on a flexible film; and a test board configured to connect and test electrical performance of the semiconductor chip.

17. The bending test apparatus of claim 16, wherein the first bending jig and the second bending jig are configured to bend the semiconductor chip bent vertically upward or downward during the electrical performance testing.

18. The bending test apparatus of claim 16, wherein the continuously convex contour of the first bending jib is in contact with the flexible film.

19. The bending test apparatus of claim 16, wherein a semiconductor chip package comprises the semiconductor chip.

20. The bending test apparatus of claim 19, wherein each of the first and second bending jigs has a horizontal length less than a length of the semiconductor chip package.

* * * * *